(12) United States Patent
Jung et al.

(10) Patent No.: US 11,372,496 B2
(45) Date of Patent: Jun. 28, 2022

(54) DISPLAY DEVICE HAVING DIELECTRIC CONSTANT CONTROL LAYER

(71) Applicant: SAMSUNG DISPLAY CO., LTD., Yongin-si (KR)

(72) Inventors: Jiwon Jung, Seoul (KR); Changmok Kim, Yongin-si (KR); Ji Hwang Lee, Hwaseong-si (KR); Young Seo Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/139,736

(22) Filed: Dec. 31, 2020

(65) Prior Publication Data
US 2021/0294451 A1  Sep. 23, 2021

(30) Foreign Application Priority Data
Mar. 20, 2020 (KR) .......... 10-2020-0034292

(51) Int. Cl.
*G06F 3/041* (2006.01)
*G06F 3/044* (2006.01)
*H01L 27/32* (2006.01)

(52) U.S. Cl.
CPC .......... *G06F 3/0416* (2013.01); *G06F 3/0443* (2019.05); *G06F 3/0446* (2019.05); *H01L 27/323* (2013.01)

(58) Field of Classification Search
CPC .... G06F 3/0416; G06F 3/0446; G06F 3/0443; G06F 3/04186; H01L 27/323; H01L 51/5284; H01L 41/0478; H05K 1/0393; H01Q 1/243; G09G 3/36
See application file for complete search history.

(56) References Cited

U.S. PATENT DOCUMENTS

| 9,382,457 | B2 | 7/2016 | Kim et al. |
| 9,698,203 | B2 | 7/2017 | Cho et al. |
| 10,068,728 | B2 | 9/2018 | Huska et al. |
| 10,198,138 | B2 | 2/2019 | Hur et al. |
| 10,474,279 | B2 | 11/2019 | Hwang et al. |
| 2013/0154994 | A1 | 6/2013 | Yang |

(Continued)

FOREIGN PATENT DOCUMENTS

| KR | 10-1562088 | 10/2015 |
| KR | 10-2015-0124075 | 11/2015 |

(Continued)

OTHER PUBLICATIONS

Jiongxin Lu, et al., "Synthesis and dielectric properties of novel high-K polymer composites containing in-situ formed silver nanoparticles for embedded capacitor applications", Journal of Materials Chemistry, 2006, 16, 1543-1548.

(Continued)

*Primary Examiner* — Richard J Hong
(74) *Attorney, Agent, or Firm* — F. Chau & Associates, LLC

(57) ABSTRACT

A display device includes a display panel, an input sensor disposed on the display panel, and an upper layer structure disposed on the input sensor. The upper layer structure includes a dielectric constant control layer which controls a sensing sensitivity of the input sensor.

27 Claims, 13 Drawing Sheets

(56) References Cited

U.S. PATENT DOCUMENTS

| | | | |
|---|---|---|---|
| 2014/0292683 A1* | 10/2014 | Azumi | G06F 3/0446 345/173 |
| 2015/0301659 A1* | 10/2015 | Umemoto | H05K 1/0393 345/174 |
| 2018/0348949 A1* | 12/2018 | Kim | G06F 3/04186 |
| 2018/0373372 A1* | 12/2018 | Kim | H01L 27/323 |
| 2019/0019450 A1* | 1/2019 | Ahn | H01L 51/5284 |
| 2020/0285347 A1* | 9/2020 | Ma | G09G 3/36 |
| 2020/0381610 A1* | 12/2020 | Arimoto | H01L 41/0478 |
| 2021/0203056 A1* | 7/2021 | Huh | H01Q 1/243 |

FOREIGN PATENT DOCUMENTS

| KR | 10-2016-0149919 | 12/2016 |
|---|---|---|
| KR | 10-2018-0036466 | 4/2018 |

OTHER PUBLICATIONS

Petru V. Notingher et al., Polyethylene thermoplastic polymer composites with neodymium filler Symposium de Génie Electrique EF-EPF-MGE 2014, 8-10.

P. Barber et al., Polymer Composite and Nanocomposite Dielectric Materials for Pulse Power Energy Storage Materials 2009, 2, 1697-1733.

\* cited by examiner

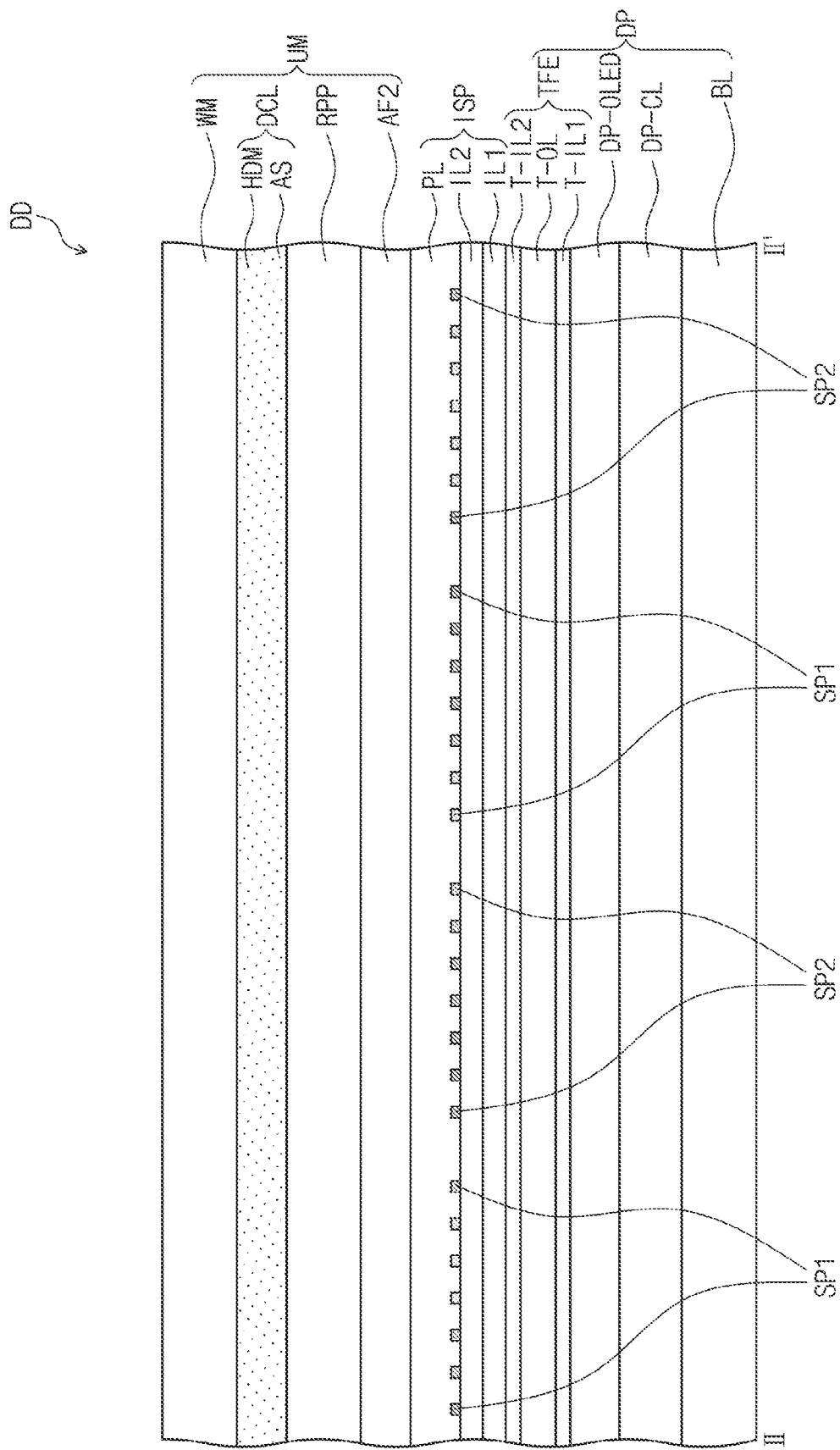

DISPLAY DEVICE HAVING DIELECTRIC CONSTANT CONTROL LAYER

CROSS-REFERENCE TO RELATED APPLICATIONS

This application claims priority under 35 U.S.C. § 119 to Korean Patent Application No. 10-2020-0034292, filed on Mar. 20, 2020, the disclosure of which is hereby incorporated by reference in its entirety.

TECHNICAL FIELD

Exemplary embodiments of the inventive concept relate to a display device, and more particularly, to a display device having improved sensing sensitivity.

DISCUSSION OF RELATED ART

Various display devices used in multimedia devices such as a television set, a mobile phone, a tablet computer, a navigation unit, a game console, etc. are currently being developed. Traditional input devices for such display devices include, for example, a keyboard, a mouse, etc. Recently, a detection sensor capable of sensing inputs applied from the outside such as, for example, a touch input provided by a user, have been utilized as an input device for display devices.

SUMMARY

Exemplary embodiments of the present inventive concept provide a display device having improved sensing sensitivity of an input sensor.

According to an exemplary embodiment of the inventive concept, a display device includes a display panel, an input sensor disposed on the display panel, and an upper layer structure disposed on the input sensor. The upper layer structure includes a dielectric constant control layer which controls a sensing sensitivity of the input sensor.

In an exemplary embodiment, the upper layer structure includes a plurality of layers sequentially stacked on the input sensor, and the dielectric constant control layer is disposed adjacent to at least one of the plurality of layers.

In an exemplary embodiment, the dielectric constant control layer includes a base material having an adhesive property, and a high dielectric constant material having a higher dielectric constant than the base material.

In an exemplary embodiment, the high dielectric constant material has a dielectric constant of about 2.5 or greater.

In an exemplary embodiment, the high dielectric constant material has a weight ratio greater than about 0 wt % and equal to or less than about 99 wt %.

In an exemplary embodiment, the high dielectric constant material includes one of an antistatic agent, a metallic oxide, or a conductive filler.

In an exemplary embodiment, the antistatic agent includes at least one of ethoxylated amine, lauric diethanolamide, ammonium (NH4+), phosphonium (PH4+), imidazolluim, pyridinium, or lithium ions (Li+).

In an exemplary embodiment, the metallic oxide includes at least one of $ZrO_2$, $Ta_2O_5$, $SnO_2$, $Nb_2O_3$, $TiO_2$, $Sb_2O_3$, $V_2O_5$, FeO, SrO, $CuO_2$, ZnO, $Nb_2O_5$, $Ta_2O_5$, $Y_2O_3$, $CaTiO_3$, $MgZrSrTiO_6$, $MgTiO_3$, $MgAl_2O_4$, $BaZrO_3$, $BaTiO_3$, $BaSnO_3$, $BaNb_2O_6$, $BaTa_2O_6$, $BaSrTiO_3$, $WO_3$, $MnO_2$, $SrZrO_3$, $SnTiO_4$, $ZrTiO_4$, $CaZrO_3$, $CaSnO_3$, $CaWO_4$, $MgTa_2O_6$, $MrZrO_3$, $La_2O_3$, $CaZrO_3$, $MgSnO_3$, $MgNb_2O_6$, $SrNb_2O_6$, $MgTa_2O_6$, or $Ta_2O_3$.

In an exemplary embodiment, the conductive filler includes at least one of metal nanoparticles, single-walled carbon nanotubes, multi-walled carbon nanotubes, graphene, graphite, carbon black, carbon fiber, or fullerene.

In an exemplary embodiment, the upper layer structure includes an anti-reflector disposed on the input sensor and a window disposed on the anti-reflector.

In an exemplary embodiment, the dielectric constant control layer is disposed between the anti-reflector and the input sensor.

In an exemplary embodiment, the upper layer structure further includes an adhesive film disposed between the window and the anti-reflector.

In an exemplary embodiment, the dielectric constant control layer is disposed between the window and the anti-reflector.

In an exemplary embodiment, the upper layer structure further includes an adhesive film disposed between the anti-reflector and the input sensor.

In an exemplary embodiment, the dielectric constant control layer includes a first dielectric constant control layer disposed between the anti-reflector and the input sensor, and a second dielectric constant control layer disposed between the window and the anti-reflector.

In an exemplary embodiment, the first and second dielectric constant control layers each include a base material having an adhesive property, and a high dielectric constant material having a higher dielectric constant than the base material.

In an exemplary embodiment, at least one of the anti-reflector or the window includes a base material and a high dielectric constant material having a higher dielectric constant than the base material.

In an exemplary embodiment, the high dielectric constant material includes one of an antistatic agent, a metallic oxide, or a conductive filler.

In an exemplary embodiment, the display panel includes a display element layer having a light emitting element and an encapsulation layer covering the display element layer.

In an exemplary embodiment, the input sensor is directly disposed on the encapsulation layer.

In an exemplary embodiment, the input sensor includes a protective layer, and a high refractive insulating layer disposed on the protective layer and having a higher refractive index than the protective layer.

According to an exemplary embodiment of the inventive concept, a display device includes a display panel, an input sensor disposed on the display panel, and a dielectric constant control layer disposed on the input sensor. The dielectric constant control layer controls a sensing sensitivity of the input sensor and includes a base material having an adhesive property, and a high dielectric constant material having a higher dielectric constant than the base material.

BRIEF DESCRIPTION OF THE DRAWINGS

The above and other features of the present inventive concept will become more apparent by describing in detail exemplary embodiments thereof with reference to the accompanying drawings, in which:

FIG. 6A is a cross-sectional view of a display device taken along line II-II' shown in FIG. 4 according to an exemplary embodiment of the inventive concept.

DETAILED DESCRIPTION

Figure 1A:
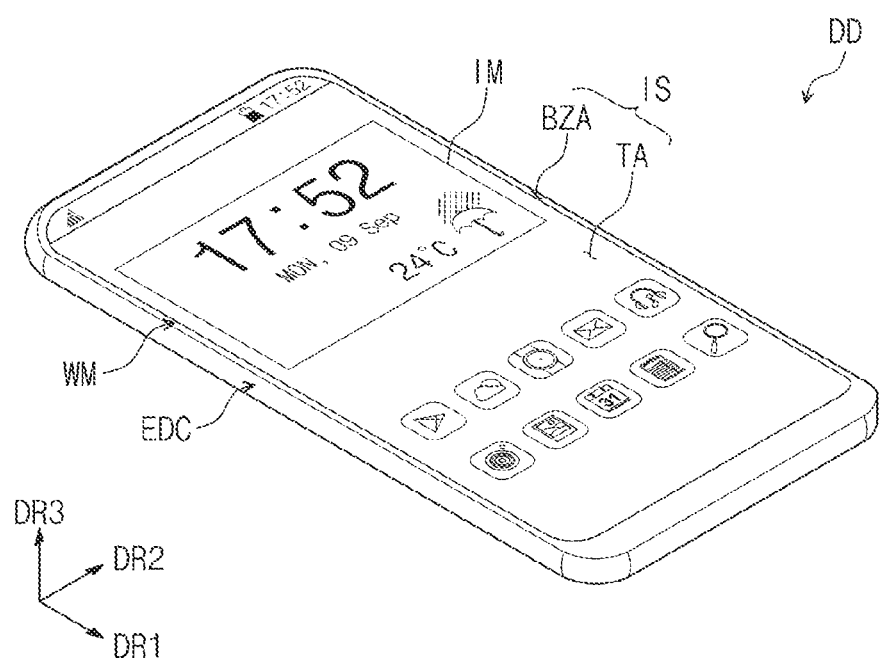
FIG. 1A is a perspective view of a display device according to an exemplary embodiment of the inventive concept.

Exemplary embodiments of the present inventive concept will be described more fully hereinafter with reference to the accompanying drawings. Like reference numerals may refer to like elements throughout the accompanying drawings.

It will be understood that when a component such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationship between components should be interpreted in a like fashion.

The term "and/or," includes all combinations of one or more of which associated configurations may define.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of exemplary embodiments of the inventive concept.

The terms of a singular form may include plural forms unless the context clearly indicates otherwise.

In addition, terms such as "below," "lower," "above," "upper," etc. are used to describe the relationship of the configurations shown in the drawings. The terms are used as a relative concept and are described with reference to the direction indicated in the drawings.

In addition, in the present disclosure, the term "on" may include the case of being disposed on a lower part as well as an upper part.

It should be understood that the terms "comprise" or "have" are intended to specify the presence of stated features, integers, steps, operations, elements, components, or combinations thereof in the disclosure, but do not preclude the presence or addition of one or more other features, integers, steps, operations, elements, components, or combinations thereof.

It should be understood that descriptions of features or aspects within each exemplary embodiment should typically be considered as available for other similar features or aspects in other exemplary embodiments, unless the context clearly indicates otherwise.

Hereinafter, exemplary embodiments of the inventive concept will be described with reference to the accompanying drawings.

The term "about" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations as understood by one of the ordinary skill in the art. Further, it is to be understood that while parameters may be described herein as having "about" a certain value, according to exemplary embodiments, the parameter may be exactly the certain value or approximately the certain value within a measurement error as would be understood by a person having ordinary skill in the art.

Figure 1B:
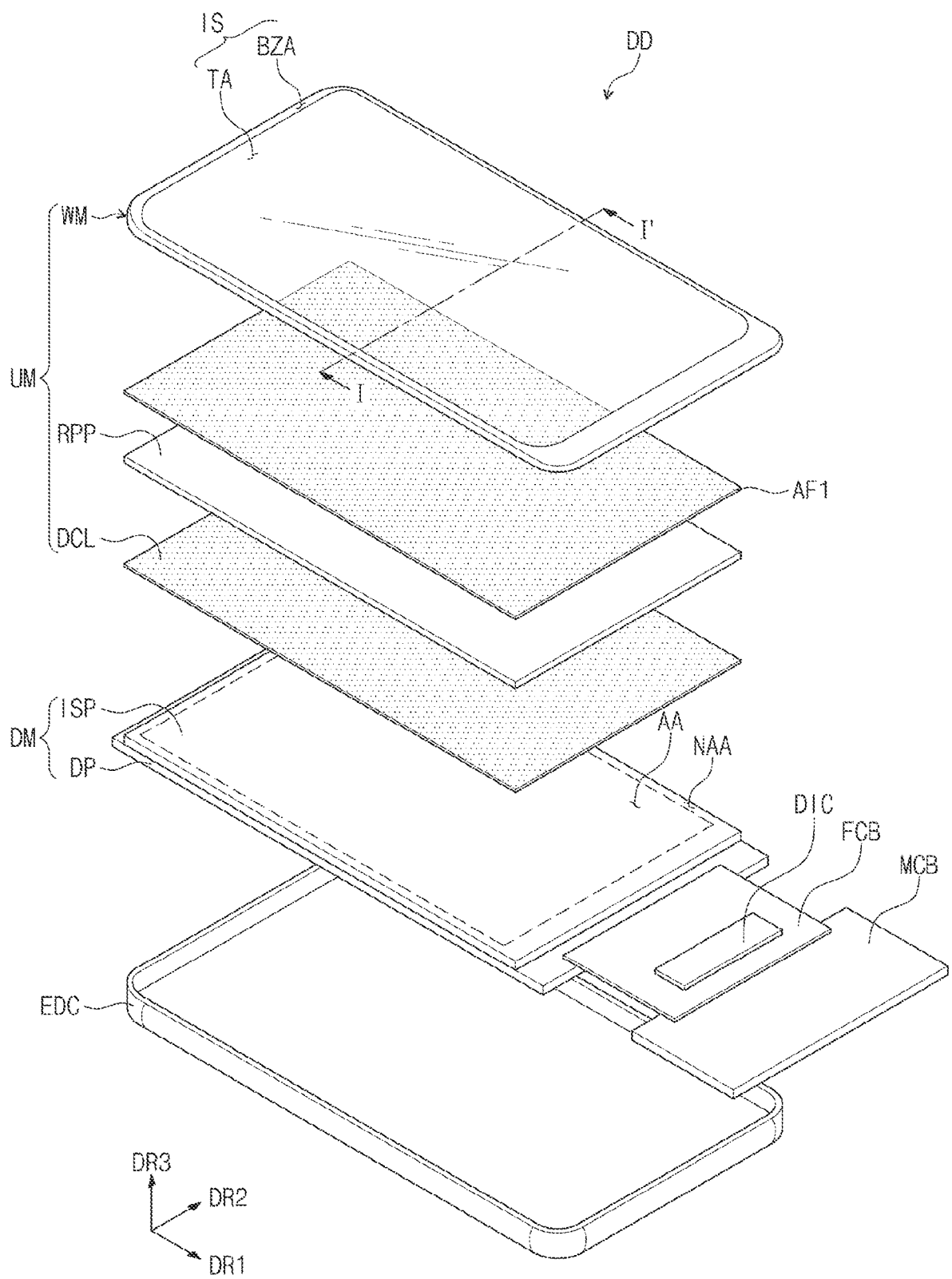
FIG. 1B is an exploded perspective view of a display device according to an exemplary embodiment of the inventive concept.
Figure 2A:
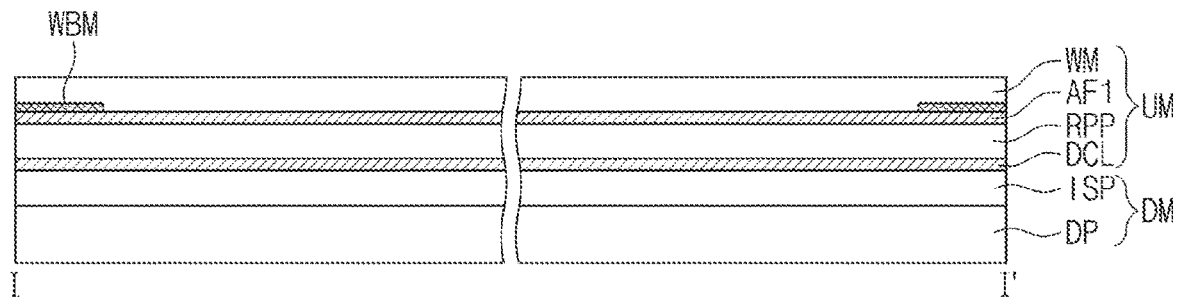
FIG. 2A is a cross-sectional view of a display device taken along line I-I' shown in FIG. 1B according to an exemplary embodiment of the inventive concept.
Figure 2B:
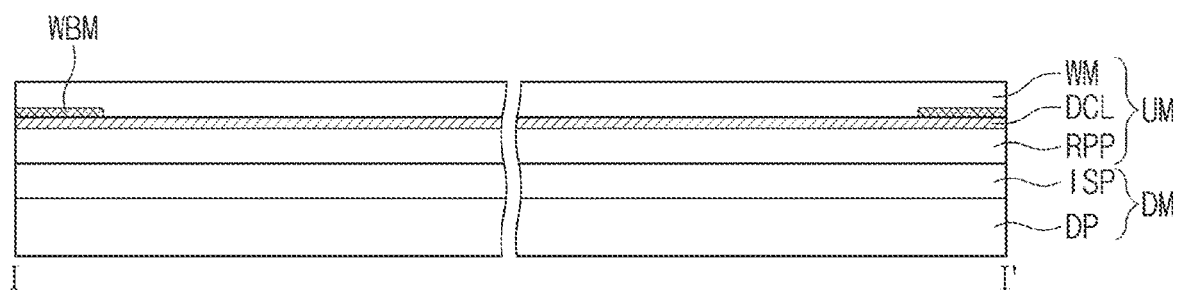
FIG. 2B is a cross-sectional view of a display device taken along line I-I' shown in FIG. 1B according to an exemplary embodiment of the inventive concept.
Figure 2C:
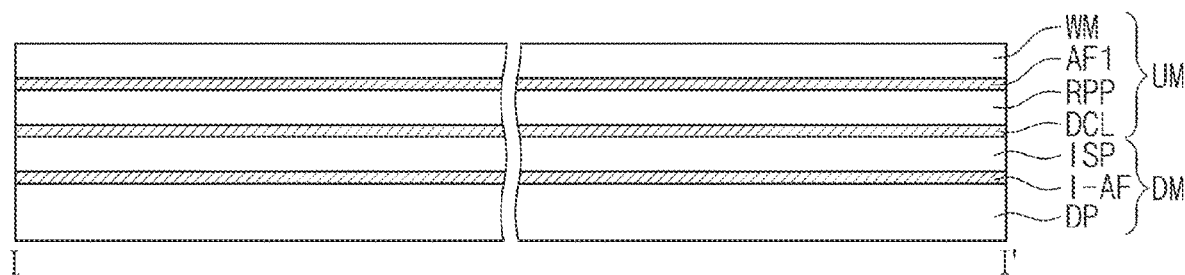
FIG. 2C is a cross-sectional view of a display device taken along line I-I' shown in FIG. 1B according to an exemplary embodiment of the inventive concept.

FIG. 1A is a perspective view of a display device according to an exemplary embodiment of the inventive concept. FIG. 1B is an exploded perspective view of a display device according to an exemplary embodiment of the inventive concept. FIG. 2A is a cross-sectional view of a display device taken along line I-I' shown in FIG. 1B according to an exemplary embodiment of the inventive concept. FIG. 2B is a cross-sectional view of a display device taken along line I-I' shown in FIG. 1B according to an exemplary embodiment of the inventive concept. FIG. 2C is a cross-sectional view of a display device taken along line I-I' shown in FIG. 1B according to an exemplary embodiment of the inventive concept.

Referring to FIGS. 1A to 2A, a display device DD may be a device activated according to electrical signals. The display device DD may include various exemplary embodiments. For example, the display device DD may be applied to electronic devices such as a smartwatch, a tablet computer, a laptop, a desktop computer, a smart television, etc. However, the display device DD is not limited thereto.

The display device DD may display an image IM toward a third direction DR3 on a display surface IS parallel to a first direction DR1 and a second direction DR2, respectively. The display surface IS on which the image IM is displayed may correspond to a front surface of the display device DD. The image IM may include a still image as well as a dynamic image.

In an exemplary embodiment, a front surface (or an upper surface) and a rear surface (or a lower surface) of each member is defined based on a direction in which the image IM is displayed. The front and rear surfaces may oppose each other in the third direction DR3, and the normal direction of each of the front and rear surfaces may be parallel to the third direction DR3.

The separation distance between the front surface and the rear surface in the third direction DR3 may correspond to the thickness in the third direction DR3 of the display device DD. A direction indicated by the first to third directions DR1, DR2, and DR3 are relative concepts, and may thus be changed to other directions.

The display device DD may sense an external input applied from the outside. The external input may include various forms of inputs provided from the outside the display device DD. For example, the external input may include an external input (e.g., hovering) applied approaching to the display device DD or adjacent by a predetermined distance, without physically contacting the display device DD, as well as physical contact by a part of the body such as a user's hand. In addition, the external input may have various forms such as, for example, force, pressure, temperature, and light.

The front surface of the display device DD may be divided into a transmission area TA and a bezel area BZA. The transmission area TA may be an area in which the image IM is displayed. A user views the image IM through the transmission area TA. In an exemplary embodiment, the transmission area TA is shown in a rectangular shape with rounded corners. However, this is exemplarily illustrated, and the shape of the transmission area TA is not limited thereto.

The bezel area BZA is adjacent to the transmission area TA. The bezel area BZA may have a predetermined color. The bezel area BZA may surround the transmission area TA. Accordingly, the shape of the transmission area TA may be substantially defined by the bezel area BZA. However, this is exemplarily illustrated, and the inventive concept is not limited thereto. For example, according to exemplary embodiments, the bezel area BZA may be disposed adjacent to only one side of the transmission area TA, adjacent to some but not all sides of the transmission area TA, or may be omitted.

As shown in FIGS. 1B and 2A, the display device DD may include a display module DM and an upper module UM disposed on the display module DM. The display module DM may include a display panel DP and an input sensor ISP. The upper module UM may include a dielectric constant control layer DCL which controls the sensing sensitivity of the input sensor ISP. The upper module UM may further include a window WM and an anti-reflector RPP. In an exemplary embodiment, the dielectric constant control layer DCL may be disposed between the anti-reflector RPP and the input sensor ISP. However, a position of the dielectric constant control layer DCL is not limited thereto, and the dielectric constant control layer DCL may be disposed at various positions in the upper module UM according to exemplary embodiments.

According to exemplary embodiments, the upper module UM may include a plurality of layers including, for example, at least some of the layers described above, sequentially stacked on the input sensor ISP. Thus, the upper module UM may also be referred to herein as an upper layer structure or an upper multilayer structure. The dielectric constant control layer DCL may be disposed adjacent to at least one of the plurality of layers sequentially stacked on the input sensor ISP that form the upper module UM.

The display panel DP according to an exemplary embodiment of the inventive concept may be a light emitting display panel. However, the display panel DP is not limited thereto. For example, the display panel DP may be an organic light emitting display panel or a quantum dot light emitting display panel. An emission layer of the organic light emitting display panel may include an organic light emitting material. An emission layer of the quantum dot light emitting display panel may include a quantum dot, a quantum rod, etc. Hereinafter, the display panel DP will be described as an organic light emitting display panel.

According to FIG. 2A, the input sensor ISP may be directly disposed on the display panel DP. For example, in an exemplary embodiment, the input sensor ISP may directly contact the display panel DP, and no intervening elements may be disposed therebetween. According to an exemplary embodiment of the inventive concept, the input sensor ISP may be formed on the display panel DP through a continuous process. That is, in an exemplary embodiment, when the input sensor ISP is directly disposed on the display panel DP, an adhesive film is not disposed between the input sensor ISP and the display panel DP. However, as shown in FIG. 2C, in an exemplary embodiment, an internal adhesive film I-AF may be disposed between the input sensor ISP and the display panel DP. In this case, the input sensor ISP is not manufactured through a continuous process with the display panel DP, but rather, after being manufactured through a separate process from the display panel DP, the input sensor ISP may be fixed on an upper surface of the display panel DP by the internal adhesive film I-AF.

The display panel DP generates an image, and the input sensor ISP acquires coordinate information of an external input (e.g., a touch event). For example, the input sensor ISP may acquire coordinate information indicating a location at which an external input (e.g., a touch event) has occurred.

The window WM may be formed of a transparent material capable of emitting images. For example, the window WM may be formed of glass, sapphire, plastic, etc. In FIGS. 2A-2C, the window WM is shown as a single layer. However, the window WM is not limited thereto. For example, according to exemplary embodiments, the window WM may include a plurality of layers. The bezel area BZA of the display device DD described above may be provided as an area in which a material including a predetermined color is printed on an area of the window WM. In an exemplary embodiment, the window WM may include a light blocking pattern WBM which defines the bezel area BZA. The light blocking pattern WBM may be a colored organic film and may be formed, for example, by a coating method.

The anti-reflector RPP reduces reflectance of external light incident from an upper side of the window WM. The anti-reflector RPP according to an exemplary embodiment of the inventive concept may include a retarder and a polarizer. The retarder may be a film type or a liquid crystal coating type, and may include a $\lambda/2$ retarder and/or a $\lambda/$retarder. The polarizer may also be a film type or a liquid crystal coating type. The film type may include a stretched synthetic resin film, and the liquid crystal coating type may include liquid crystals arranged in a predetermined arrangement. The retarder and the polarizer may be implemented as one polarizing film. The anti-reflector RPP may further include a protective film disposed above or below the polarizing film.

The anti-reflector RPP may be disposed on the input sensor ISP. For example, the anti-reflector RPP may be disposed between the input sensor ISP and the window WM. The anti-reflector RPP and the window WM may be bonded to each other through an adhesive film AF1. As an example of the inventive concept, the adhesive film AF1 may include an optically clear adhesive film OCA. However, the adhesive film AF1 is not limited thereto, and may include, for example, an adhesive agent or a gluing agent. For example, the adhesive film AF1 may include an optically clear resin OCR or a pressure sensitive adhesive film PSA.

The dielectric constant control layer DCL may be disposed between the input sensor ISP and the anti-reflector RPP. In an exemplary embodiment, the input sensor ISP and the anti-reflector RPP may be bonded to each other through the dielectric constant control layer DCL. For example, in an exemplary embodiment, the dielectric constant control layer DCL may have an adhesive property that bonds the input sensor ISP and the anti-reflector RPP to each other.

In FIG. 2A, a structure in which the anti-reflector RPP is fixed to the input sensor ISP through the dielectric constant control layer DCL is shown. However, the inventive concept is not limited thereto. For example, as shown in FIG. 2B, in an exemplary embodiment, the anti-reflector RPP may be formed on the input sensor ISP through a continuous process. In this case, the anti-reflector RPP does not include a polarizing film, and may include color filters directly disposed on the input sensor ISP, and intervening elements are not disposed between the anti-reflector RPP and the input sensor ISP.

When the anti-reflector RPP includes color filters directly disposed on the input sensor ISP, the dielectric constant control layer DCL may be disposed between the window WM and the anti-reflector RPP. In this case, the window WM may be bonded to the anti-reflector RRP through the dielectric constant control layer DCL. For example, in an exemplary embodiment, the dielectric constant control layer DCL may have an adhesive property that bonds the window WM and the anti-reflector RRP to each other. As such, the position of the dielectric constant control layer DCL is not particularly limited in the upper module UM. For example, the dielectric constant control layer DCL may be included in the anti-reflector RPP or the window WM.

The display module DM may display an image according to an electrical signal and transmit/receive information about the external input. The display module DM may be defined as an active area AA and a peripheral area NAA. The active area AA may be defined as an area in which an image (e.g., the image IM shown in FIG. 1A) provided by the display module DM is output.

The peripheral area NAA is adjacent to the active area AA, as shown in FIG. 1B. For example, the peripheral area NAA may surround the active area AA. However, this is exemplarily illustrated, and the peripheral area NAA may be defined in various shapes and is not limited thereto. According to an exemplary embodiment, the active area AA of the display module DM may correspond to at least a part of the transmission area TA.

The display module DM may further include a main circuit board MCB, a flexible circuit film FCB, and a driving chip DIC.

The main circuit board MCB may be connected to the flexible circuit film FCB to be electrically connected to the display panel DP. The main circuit board MCB may include a plurality of driving elements. The plurality of driving elements may include a circuit unit which drives the display panel DP.

The flexible circuit film FCB is connected to the display panel DP to electrically connect the display panel DP and the main circuit board MCB. The driving chip DIC may be mounted on the flexible circuit film FCB.

The driving chip DIC may include driving elements such as, for example, a data driving circuit which drives a pixel of the display panel DP. Although FIG. 1B illustrates a single flexible circuit film FCB, the inventive concept is not limited thereto. For example, in an exemplary embodiment, the flexible circuit film FCB may be provided in plural to be connected to the display panel DP.

FIG. 1B shows a structure in which the driving chip DIC is mounted on the flexible circuit film FCB. However, the inventive concept is not limited thereto. For example, in an exemplary embodiment, the driving chip DIC may be directly mounted on the display panel DP. In this case, a part on which the driving chip DIC is mounted on the display panel DP may be bent and disposed on a rear surface of the display module DM.

The input sensor ISP may be electrically connected to the main circuit board MCB through the flexible circuit film FCB. However, the inventive concept is not limited thereto. For example, in an exemplary embodiment, the display module DM may additionally include a separate flexible circuit film which electrically connects the input sensor ISP to the main circuit board MCB.

The display device DD may further include an outer case EDC accommodating the display module DM. The outer case EDC may be combined with the window WM to define an exterior of the display device DD. The outer case EDC may absorb shock and impact applied from the outside, and may prevent foreign substances/moisture from penetrating into the display module DM, thereby protecting the components of the display device DD. In an exemplary embodiment, the outer case EDC may be provided in the form in which a plurality of storage members are combined.

The display device DD according to an exemplary embodiment may further include, for example, an electronic module containing various functional modules for operating the display module DM, a power supply module which supplies power required for the overall operation of the display device DD, and a bracket combined with the display module DM and/or the outer case EDC which separates the internal space of the display device DD.

Figure 3:
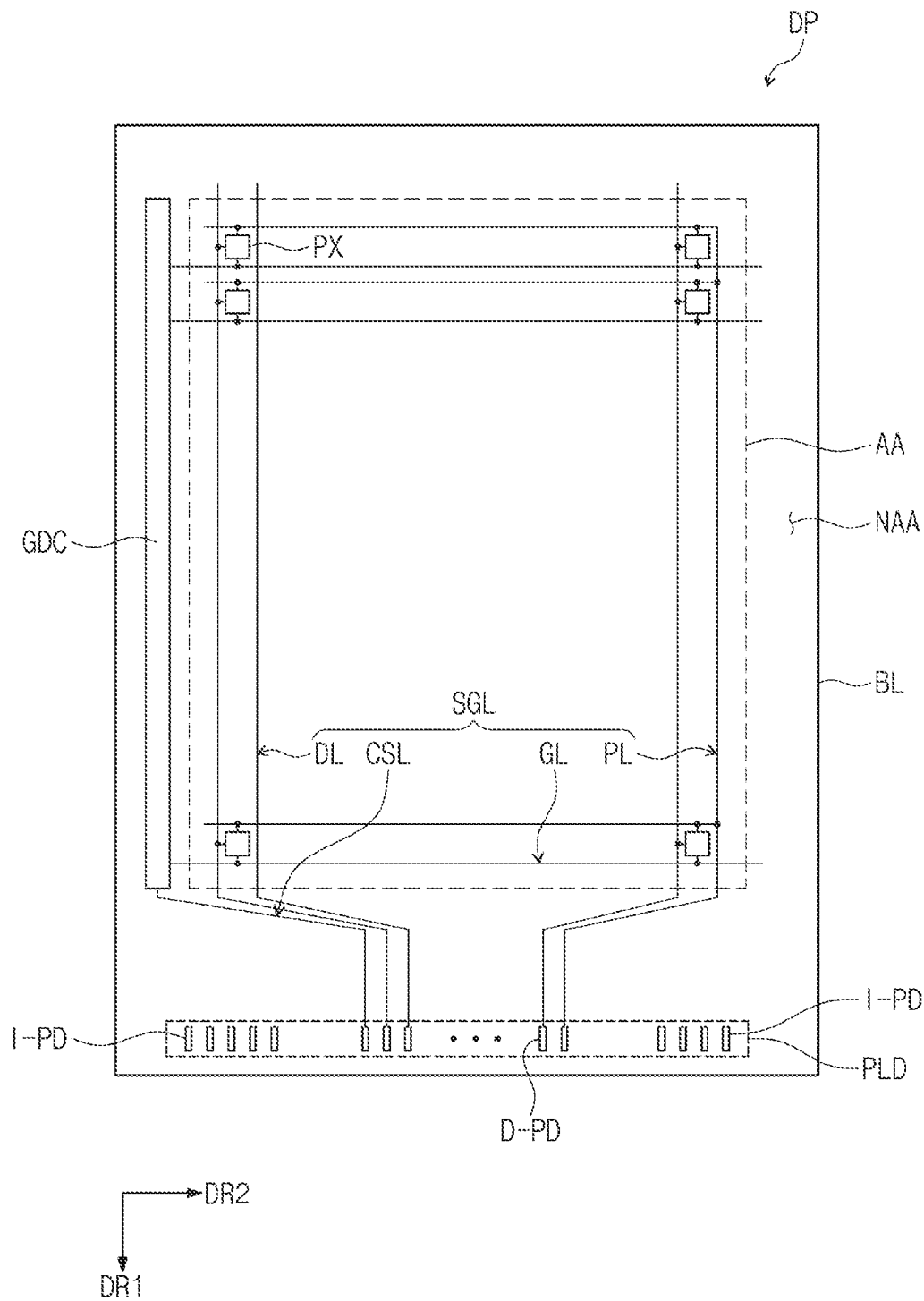
FIG. 3 is a plan view of a display panel according to an exemplary embodiment of the inventive concept.
Figure 4:
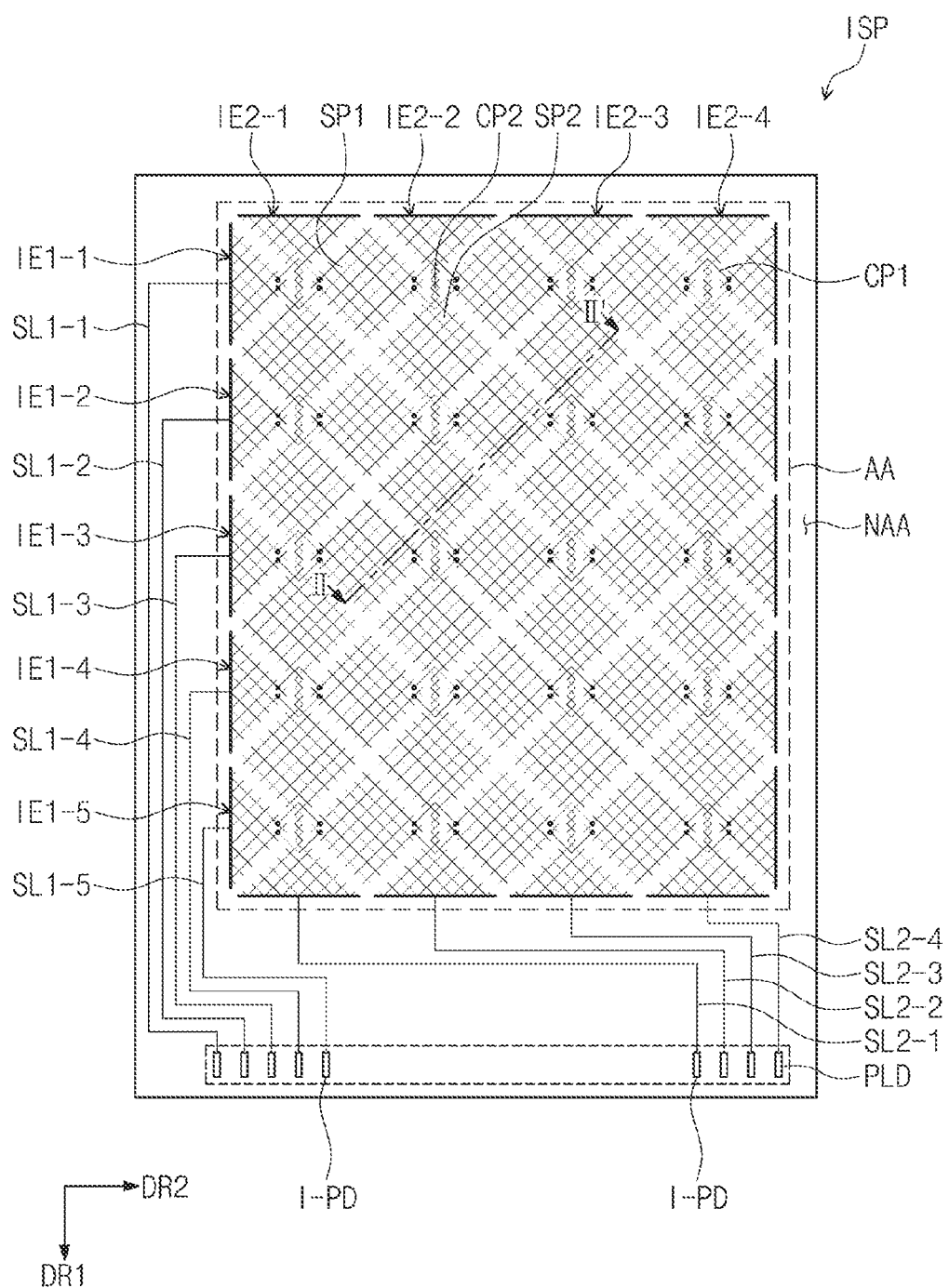
FIG. 4 is a plan view of an input sensor according to an exemplary embodiment of the inventive concept.

FIG. 3 is a plan view of a display panel according to an exemplary embodiment of the inventive concept. FIG. 4 is a plan view of an input sensor according to an exemplary embodiment of the inventive concept.

Referring to FIGS. 3 and 4, the display panel DP may include a driving circuit GDC, a plurality of signal lines SGL, and a plurality of pixels PX. The display panel DP may further include a pad part PLD disposed in the peripheral area NAA. The pad part PLD includes pixel pads D-PD connected to a corresponding signal line among the plurality of signal lines SGL.

The pixels PX are disposed in the active area AA. The pixels PX each include an organic light emitting diode and a pixel driving circuit connected thereto. The driving circuit GDC, the signal lines SGL, the pad part PLD, and the pixel driving circuit may be included in a circuit element layer DP-CL shown in FIG. 5A.

The driving circuit GDC may include a gate driving circuit. The gate driving circuit generates a plurality of gate signals and sequentially outputs the gate signals to a plurality of gate lines GL, which will be described in further detail below. The gate driving circuit may further output another control signal to the pixel driving circuit.

The signal lines SGL may include gate lines GL, data lines DL, a power line PL, and a control signal line CSL. The gate lines GL, the data lines DL, and the power line PL may be connected to the pixels PX. The control signal line CSL may provide control signals to the driving circuit GDC. The signal lines SGL overlap the active area AA and the peripheral area NAA.

The pad part PLD is a part to which the flexible circuit film FCB (shown in FIG. 1B) is connected, and may include the pixel pads D-PD, which connect the flexible circuit film FCB to the display panel DP. The pad part PLD further includes input pads I-PD which connect the flexible circuit film FCB to the input sensor ISP. Portions of the wirings disposed in the circuit element layer DP-CL are exposed from an insulating layer included in the circuit element layer DP-CL, and the exposed portions are provided as the pixel pads D-PD and the input pads I-PD.

The pixel pads D-PD are connected to corresponding pixels PX through the signal lines SGL. In addition, the driving circuit GDC may be connected to any one of the pixel pads D-PD.

Referring to FIG. 4, the input sensor ISP according to an exemplary embodiment of the inventive concept may include first sensing electrodes IE1-1 to IE1-5, first signal lines SL1-1 to SL1-5 connected to the first sensing electrodes IE1-1 to IE1-5, second sensing electrodes IE2-1 to IE2-4, and second signal lines SL2-1 to SL2-4 connected to the second sensing electrodes IE2-1 to IE2-4. In an exemplary embodiment, the input sensor ISP may further include third signal lines connected to the second sensing electrodes IE2-1 to IE2-4. In this case, the second signal lines SL2-1 to SL2-4 may be connected to one end of the second sensing electrodes IE2-1 to IE2-4, and the third signal lines may be connected to the other end of the second sensing electrodes IE2-1 to IE2-4.

The first sensing electrodes IE1-1 to IE1-5 and the second sensing electrodes IE2-1 to IE2-4 cross each other. The first sensing electrodes IE1-1 to IE1-5 are arranged in the first direction DR1, and each extends in the second direction DR2. The second sensing electrodes IE2-1 to IE2-4 are arranged in the second direction DR2, and each extends in the first direction DR1.

Capacitance is formed between the first sensing electrodes IE1-1 to IE1-5 and the second sensing electrodes IE2-1 to IE2-4. The capacitance between the first sensing electrodes IE1-1 to IE1-5 and the second sensing electrodes IE2-1 to IE2-4 may be changed by an external input (e.g., a touch event). In this case, the sensing sensitivity of the input sensor ISP may be determined according to the amount of change in capacitance. For example, the greater the amount of change in capacitance by an external input, the higher the sensing sensitivity of the input sensor ISP.

Each of the first sensing electrodes IE1-1 to IE1-5 includes first sensor parts SP1 and first connection parts CP1 disposed in the active area AA. Each of the second sensing electrodes IE2-1 to IE2-4 include second sensor parts SP2 and second connection parts CP2 disposed in the active area AA. Two first sensor parts SP1 disposed on both ends of each of the first sensing electrodes IE1-1 to IE1-5 among the first sensor parts SP1 may have a smaller size, for example, about ½ size, compared to the first sensor parts SP1 disposed at a center of the active area AA. Two second sensor parts SP2 disposed at both ends of each of the second sensing electrodes IE2-1 to IE2-4 among the second sensor parts SP2 may have a smaller size, for example, about ½ size, compared to the second sensor parts SP2 disposed at the center of the active area AA.

FIG. 4 shows the first sensing electrodes IE1-1 to IE1-5 and the second sensing electrodes IE2-1 to IE2-4 according to an exemplary embodiment. It is to be understood that the shape of the first sensing electrodes IE1-1 to IE1-5 and the second sensing electrodes IE2-1 to IE2-4 is not limited thereto. For example, in an exemplary embodiment, the first sensing electrodes IE1-1 to IE1-5 and the second sensing electrodes IE2-1 to IE2-4 may have a shape without separation between the sensor part and the connection part (e.g., a bar shape). Although the first sensor parts SP1 and the second sensor parts SP2 are exemplarily illustrated as having a rhombus shape, the inventive concept is not limited thereto. For example, according to exemplary embodiments, the first sensor parts SP1 and the second sensor parts SP2 may have different polygonal shapes.

The first sensor parts SP1 in one first sensing electrode are arranged along the second direction DR2, and the second sensor parts SP2 in one second sensing electrode are arranged along the first direction DR1. The first connection parts CP1 each connect adjacent first sensor parts SP1, and the second connection parts CP2 each connect adjacent second sensor parts SP2.

The first sensing electrodes IE1-1 to IE1-5 and the second sensing electrodes IE2-1 to IE2-4 may have a mesh shape. Configuring the first sensing electrodes IE1-1 to IE1-5 and the second sensing electrodes IE2-1 to IE2-4 to have a mesh shape may reduce the parasitic capacitance between electrodes of the display panel DP (see FIG. 3).

The mesh-shaped first sensing electrodes IE1-1 to IE1-5 and the mesh-shaped second sensing electrodes IE2-1 to IE2-4 may include, for example, silver, aluminum, copper, chromium, nickel, titanium, etc. for a low-temperature process, but is not limited thereto. Therefore, even when the input sensor ISP is directly formed on the display panel DP through a continuous process, damage to organic light emitting diodes may be prevented.

The first signal lines SL1-1 to SL1-5 are connected to one end of the first sensing electrodes IE1-1 to IE1-5, respectively. In an exemplary embodiment of the inventive concept, the input sensor ISP may further include signal lines connected to the other ends of the first sensing electrodes IE1-1 to IE1-5.

The first signal lines SL1-1 to SL1-5 and the second signal lines SL2-1 to SL2-4 may be disposed in the peripheral area NAA. The input pads I-PD of the pad part PLD are electrically connected to the first signal lines SL1-1 to SL1-5 and the second signal lines SL2-1 to SL2-4 of the input sensor ISP.

Figure 5A:
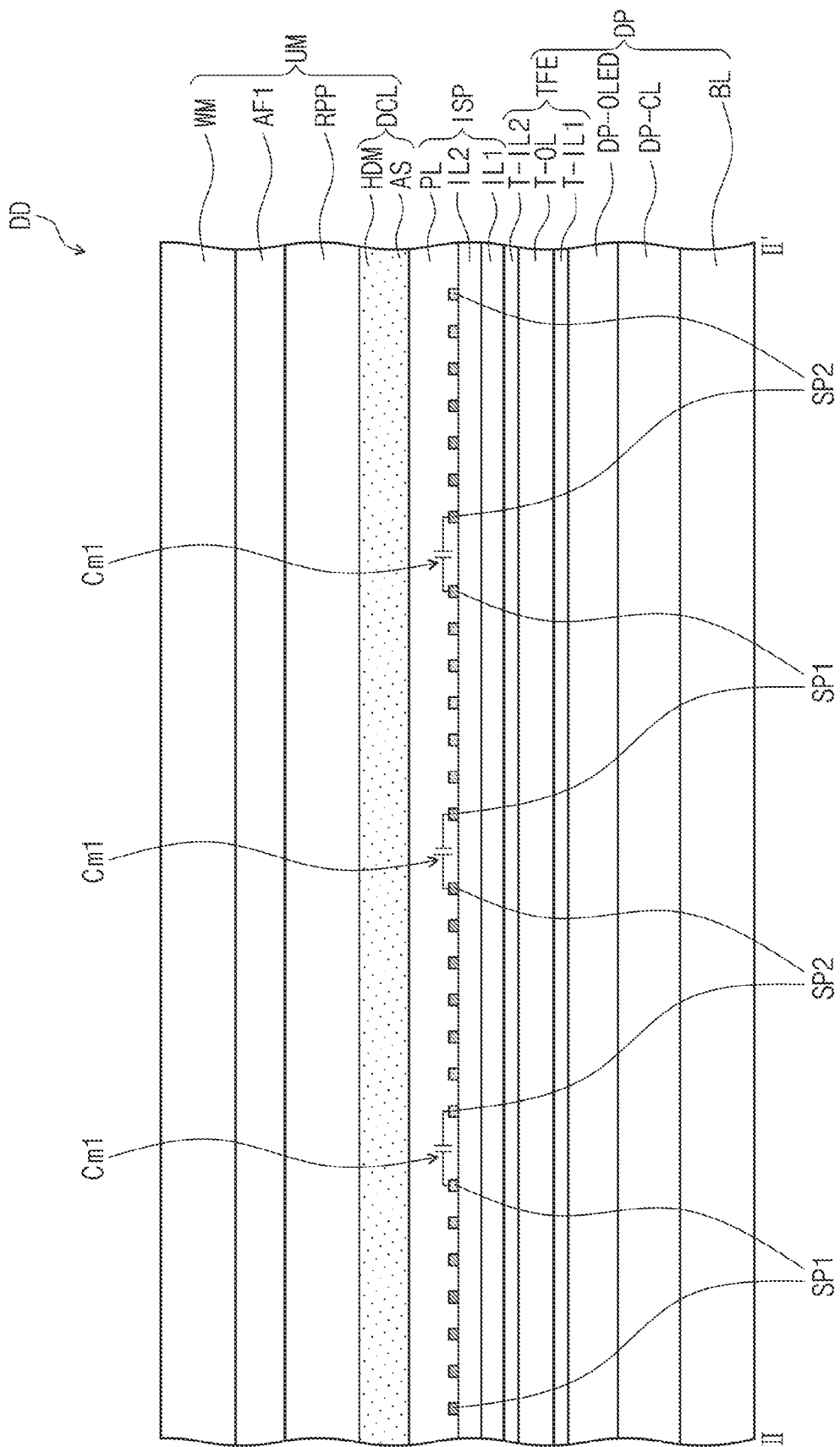
FIG. 5A is a cross-sectional view of a display device taken along line II-II' shown in FIG. 4 according to an exemplary embodiment of the inventive concept.
Figure 5B:
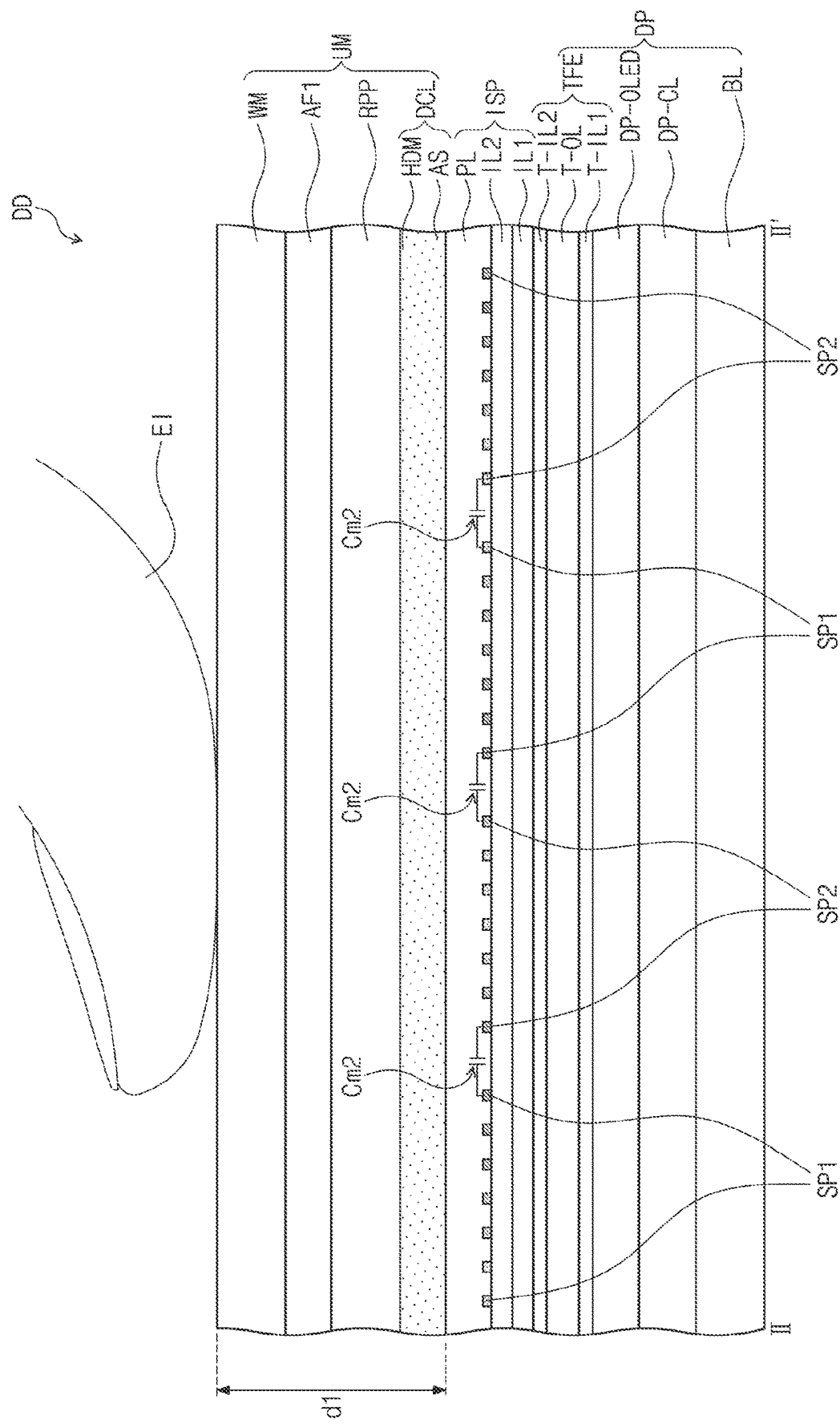
FIG. 5B is a cross-sectional view showing a state in which an external input is provided to the display device shown in FIG. 5A.

FIG. 5A is a cross-sectional view of a display device taken along line II-II' shown in FIG. 4 according to an exemplary embodiment of the inventive concept. FIG. 5B is a cross-sectional view showing a state in which external inputs are provided to the display device shown in FIG. 5A.

Referring to FIGS. 5A and 5B, the display panel DP may include a base layer BL, a circuit element layer DP-CL, a display element layer DP-OLED, and an encapsulation layer TFE.

The base layer BL may be a member that provides a base surface where the display element layer DP-OLED is disposed. The base layer BL may be, for example, a glass substrate, a metal substrate, a plastic substrate, etc. However, the inventive concept is not limited thereto. For example, according to exemplary embodiments, the base layer BL may be an inorganic layer, an organic layer, or a composite material layer.

The circuit element layer DP-CL is disposed on the base layer BL. The circuit element layer DP-CL includes at least one insulating layer and a circuit element. Hereinafter, the insulating layer included in the circuit element layer DP-CL may be referred to as an intermediate insulating layer. The intermediate insulating layer may include at least one intermediate inorganic film and at least one intermediate organic film. The circuit element includes the signal lines SGL (shown in FIG. 3) and the pixel driving circuit included in the pixel PX (shown in FIG. 3). The circuit element layer DP-CL may be formed through a process of forming an insulating layer, a semiconductor layer, and a conductive layer by coating, deposition, etc., and a process of patterning the insulating layer, the semiconductor layer, and the conductive layer by a photolithography process.

The display element layer DP-OLED may include a light emitting element which emits lights. In an exemplary embodiment, the display element layer DP-OLED may include a pixel defining layer and the organic light emitting diode. The pixel defining layer may include an organic material. An opening is defined in the pixel defining layer, and the organic light emitting diode may be disposed corresponding to the opening.

The encapsulation layer TFE is disposed on the display element layer DP-OLED. For example, the encapsulation layer TFE may cover the display element layer DP-OLED. The encapsulation layer TFE seals the display element layer DP-OLED. The input sensor ISP may be directly disposed on the encapsulation layer TFE. For example, in an exemplary embodiment, the input sensor ISP may directly contact the encapsulation layer TFE, and no intervening layers are disposed between the input sensor ISP and the encapsulation layer TFE. The encapsulation layer TFE may include at least one insulating layer. The encapsulation layer TFE according to an exemplary embodiment of the inventive concept may include at least one inorganic film (hereinafter, a first encapsulation inorganic film T-IL1). The encapsulation layer TFE according to an exemplary embodiment of the inventive concept may further include at least one organic film (hereinafter, an encapsulation organic film T-OL), and at least one inorganic film (hereinafter, a second encapsulation inorganic film T-IL2). The encapsulation organic film T-OL may be disposed between the first and second encapsulation inorganic films T-IL1 and T-IL2.

The first and second encapsulation inorganic films T-IL1 and T-IL2 may protect the display element layer DP-OLED from moisture/oxygen, and the encapsulation organic film T-OL may protect the display element layer DP-OLED from foreign substances such as, for example, dust particles. The first and second encapsulation inorganic films T-IL1 and T-IL2 may include, for example, a silicon nitride layer, a silicon oxynitride layer, a silicon oxide layer, a titanium oxide layer, an aluminum oxide layer, etc., but is not particularly limited thereto. The encapsulation organic film T-OL may include, for example, an acryl-based organic film, but is not particularly limited thereto.

The input sensor ISP includes a first insulating layer IL1, a first conductive layer disposed thereon, a second insulating layer IL2 covering the first conductive layer, and a second conductive layer disposed on the second insulating layer IL2. The first insulating layer IL1 may include an inorganic material such as, for example, a silicon nitride layer. The second encapsulation inorganic film T-IL2 disposed on an uppermost side of the encapsulation layer TFE may also include a silicon nitride layer, and the silicon nitride layer of the encapsulation layer TFE and the first insulating layer IL1 may be formed under different deposition conditions.

Referring to FIGS. 4 to 5B, the first conductive layer is disposed on the first insulating layer ILL. The first conductive layer may include the first connection parts CP1. The second conductive layer is disposed on the first conductive layer. The second conductive layer may include the first sensing parts SP1, the second sensing parts SP2, and the second connection parts CP2. The second conductive layer is disposed on the first conductive layer.

The second insulating layer IL2 is disposed between the first conductive layer and the second conductive layer. The second insulating layer IL2 separates the first conductive layer and the second conductive layer in a cross-sectional view. Contact holes partially exposing the first connection parts CP1 may be provided in the second insulating layer IL2. The first connection parts CP1 may be connected to two first sensing parts SP1 disposed adjacent to each other, respectively, through the contact hole. The second connection parts CP2 may penetrate the space between two first sensing parts SP1 disposed adjacent to each other. The second connection parts CP2 are electrically connected to two adjacent second sensing parts SP2.

The second insulating layer IL2 may include an inorganic material. For example, the second insulating layer IL2 may include a silicon nitride layer.

The input sensor ISP further includes a protective layer PL. The protective layer PL covers the second insulating layer IL2 and the second conductive layer, which includes the first sensing parts SP1, the second sensing parts SP2, and the second connection parts CP2. The protective layer PL may include an organic material. The protective layer PL may include an acryl-based resin. The protective layer PL may have a greater thickness than the first and second insulating layers IL1 and IL2.

The input sensor ISP detects a change in capacitance formed between the first and second sensing parts SP1 and SP2 to determine whether an external input EI is provided. A capacitor is formed between the first and second sensing parts SP1 and SP2, and the capacitance between the first and second sensing parts SP1 and SP2 in a standby state in which the external input EI is not provided may be defined as a first capacitance Cm1.

In a touch event state in which the external input EI is provided, the capacitance formed between the first and second sensing parts SP1 and SP2 is changed to a second capacitance Cm2. In this case, a difference between the second capacitance Cm2 and the first capacitance Cm1 may be defined as an amount of change ΔCm in the capacitance. The display device DD may detect the amount of change ΔCm in the capacitance to determine whether the external input EI is provided.

The amount of change ΔCm in the capacitance may have different values according to the distance between the first and second sensing parts SP1 and SP2, the area of each of the first and second sensing parts SP1 and SP2, the distance d1 between the external input EI and the first and second sensing parts SP1 and SP2, and the average dielectric constant of the upper module UM disposed between the external input EI and the first and second sensing parts SP1 and SP2. For example, the amount of change ΔCm in the capacitance increases when the distance between the first and second sensing parts SP1 and SP2 is smaller, and an area of each of the first and second sensing parts SP1 and SP2 is larger. In addition, the amount of change ΔCm in the capacitance increases when the distance d1 between the external input EI and the first and second sensing parts SP1 and SP2 is smaller, and increases when the average dielectric constant of the upper module UM is greater. If the distance between the first and second sensing parts SP1 and SP2, the area of each of the first and second sensing parts SP1 and SP2, and the distance d1 between the external input EI and the first and second sensing parts SP1 and SP2 are fixed, increasing the average dielectric constant of the upper module UM may increase the amount of change (ΔCm) in the capacitance.

The dielectric constant control layer DCL is provided in the upper module UM, and increases the average dielectric constant of the upper module UM. As a result, the amount of change ΔCm in capacitance may be increased. When the amount of change ΔCm in capacitance is increased by the dielectric constant control layer DCL, sensing sensitivity to the external input EI may be improved without decreasing the distance between the first and second sensing parts SP1 and SP2 or increasing the area of each of the first and second sensing parts SP1 and SP2.

The dielectric constant control layer DCL includes a base material AS and a high dielectric constant material HDM having a higher dielectric constant than the base material AS. In an exemplary embodiment, the base material AS may include an adhesive material having an adhesive property. The adhesive material is not particularly limited as long as it is a transparent material having an adhesive property for optical use. For example, the adhesive material may be formed of one of an acryl-based adhesive, a rubber-based adhesive, a silicone-based adhesive, a polyester-based adhesive, a urethane-based adhesive, an epoxy-based adhesive, or a polyether-based adhesive. In an exemplary embodiment, the base material AS may have a dielectric constant of about 1.5 to about 2.5. However, the dielectric constant of the base material AS is not limited thereto.

The high dielectric constant material HDM is formed of a material having a higher dielectric constant than the base material AS. In an exemplary embodiment, the high dielectric constant material HDM may have a dielectric constant of about 2.5 or greater. The high dielectric constant material HDM may have a weight ratio greater than about 0 wt % and equal to or less than about 99 wt % with respect to the total weight of the dielectric constant control layer DCL. The base material AS may have a weight ratio of about 1 wt % to about 99 wt % to the weight of the dielectric constant control layer DCL. However, the weight ratio of the high dielectric constant material HDM is not particularly limited. For example, the high dielectric constant material HDM may have a weight ratio of a level that may increase the average dielectric constant of the dielectric constant control layer DCL.

The average dielectric constant of the dielectric constant control layer DCL may be determined by the dielectric constant of the base material AS, the dielectric constant of the high dielectric constant material HDM, and the weight ratio of the high dielectric constant material HDM to the base material AS. When the weight ratio of the high dielectric constant material HDM to the base material AS increases, the average dielectric constant may also increase. However, when the weight ratio of the high dielectric constant material HDM becomes greater, the adhesion of the dielectric constant control layer DCL may be reduced. Therefore, the weight ratio of the high dielectric constant material HDM may be set in consideration of the adhesion of the dielectric constant control layer DCL and the average dielectric constant of the dielectric constant control layer DCL.

The high dielectric constant material HDM may include, for example, one of an antistatic agent, a metallic oxide, or a conductive filler. In an exemplary embodiment, the antistatic agent may include at least one of ethoxylated amine, lauric diethanolamide, ammonium (NH4+), phosphonium (PH4+), imidazolluim, pyridinium, or lithium ions (Li+). The metallic oxide may include at least one of, for example, $ZrO_2$, $Ta_2O_5$, $SnO_2$, $Nb_2O_3$, $TiO_2$, $Sb_2O_3$, $V_2O_5$, FeO, SrO, $CuO_2$, ZnO, $Nb_2O_5$, $Ta_2O_5$, $Y_2O_3$, $CaTiO_3$, $MgZrSrTiO_6$, $MgTiO_3$, $MgAl_2O_4$, $BaZrO_3$, $BaTiO_3$, $BaSnO_3$, $BaNb_2O_6$, $BaTa_2O_6$, $BaSrTiO_3$, $WO_3$, $MnO_2$, $SrZrO_3$, $SnTiO_4$, $ZrTiO_4$, $CaZrO_3$, $CaSnO_3$, $CaWO_4$, $MgTa_2O_6$, $MrZrO_3$, $La_2O_3$, $CaZrO_3$, $MgSnO_3$, $MgNb_2O_6$, $SrNb_2O_6$, $MgTa_2O_6$, or $Ta_2O_3$. The conductive filler may include at least one of, for example, metal nanoparticles, single-walled carbon nanotubes, multi-walled carbon nanotubes, graphene, graphite, carbon black, carbon fiber, or fullerene.

Thus, according to exemplary embodiments, the upper module UM includes a dielectric constant control layer DCL including a high dielectric constant material, which increases the average dielectric constant of the upper module UM and may improve the sensing sensitivity with relation to the external input EI.

In an exemplary embodiment, when the base material AS of the dielectric constant control layer DCL has an adhesive property, the anti-reflector RPP may be attached to the input sensor ISP through the dielectric constant control layer DCL. For example, in an exemplary embodiment, the dielectric constant control layer DCL not only serves to increase the average dielectric constant of the upper module UM, but also may serve an adhesive function that fixes the anti-reflector RPP to the input sensor ISP. Therefore, even when the dielectric constant control layer DCL is provided in the upper module UM, the overall thickness of the upper module UM may be prevented from increasing.

Figure 6B:
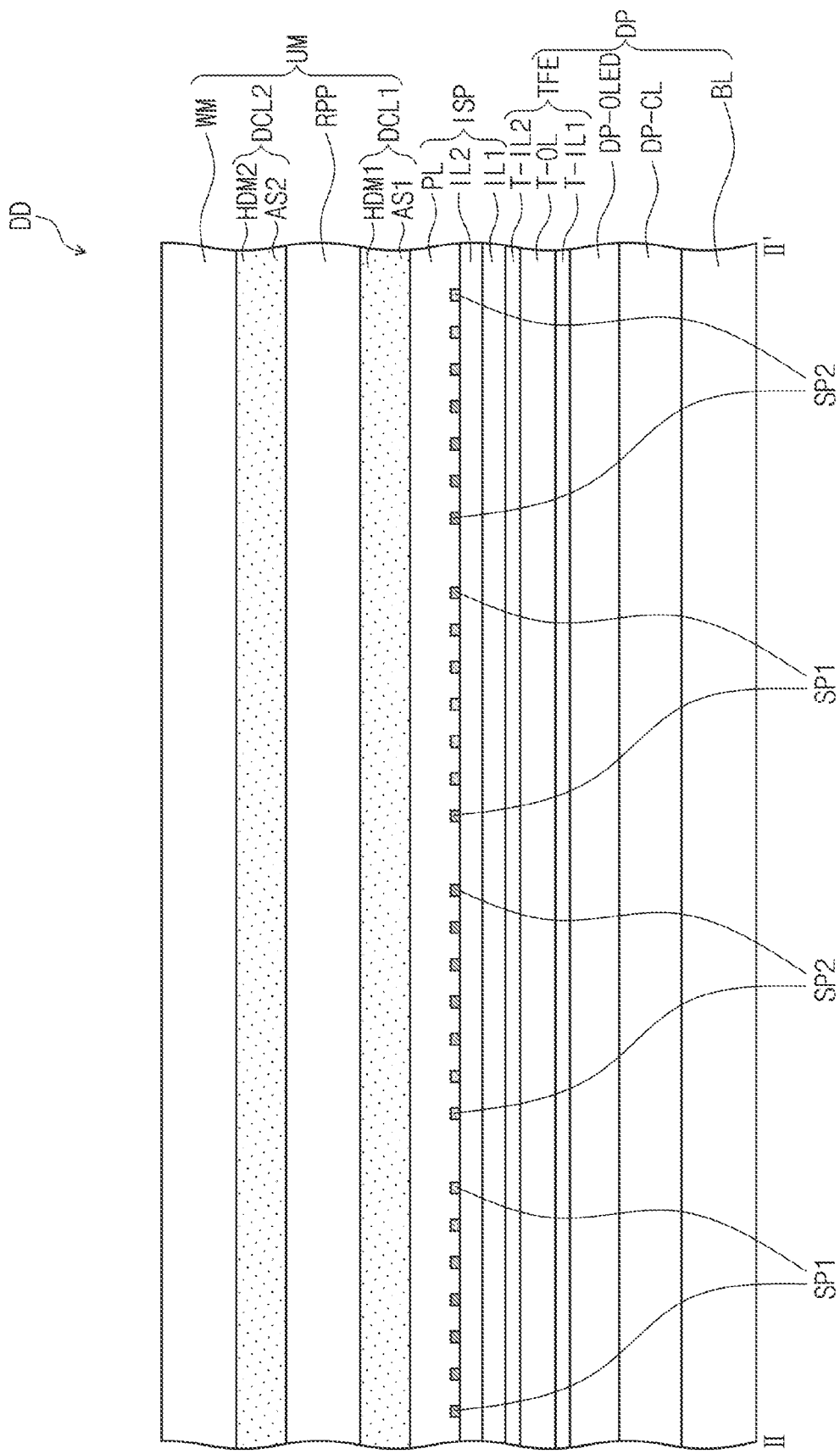
FIG. 6B is a cross-sectional view of a display device taken along line II-II' shown in FIG. 4 according to an exemplary embodiment of the inventive concept.

FIG. 6A is a cross-sectional view of a display device taken along line II-II' shown in FIG. 4 according to an exemplary embodiment of the inventive concept. FIG. 6B is a cross-sectional view of a display device taken along line II-II' shown in FIG. 4 according to an exemplary embodiment of the inventive concept.

Referring to FIG. 6A, the dielectric constant control layer DCL may be disposed between the window WM and the anti-reflector RPP. The dielectric constant control layer DCL shown in FIG. 6A may have a structure similar to the dielectric constant control layer DCL shown in FIGS. 5A and 5B. For example, the dielectric constant control layer DCL shown in FIG. 6A includes a base material AS and a high dielectric constant material HDM. The base material AS may include an adhesive material. The adhesive material is not particularly limited as long as it is a transparent material having an adhesive property for optical use. The window WM may be attached to the anti-reflector RRP through the dielectric constant control layer DCL.

The high dielectric constant material HDM may include a material having a higher dielectric constant than the base material AS. The high dielectric constant material HDM may include, for example, one of an antistatic agent, a metallic oxide, or a conductive filler. The high dielectric constant material HDM may have a weight ratio greater than about 0 wt % and equal to or less than about 99 wt % with respect to the total weight of the dielectric constant control layer DCL. However, the weight ratio of the high dielectric constant material HDM is not particularly limited.

When the dielectric constant control layer DCL is disposed between the window WM and the anti-reflector RPP, an adhesive film AF2 may be disposed between the anti-reflector RPP and the input sensor ISP. The anti-reflector RPP may be fixed to the input sensor ISP through the adhesive film AF2.

In FIGS. 5A to 6A, the upper module UM has a structure including one dielectric constant control layer DCL. However, the inventive concept is not limited thereto. For example, according to exemplary embodiments, the upper module UM may include two or more dielectric constant control layers DCL.

For example, referring to FIG. 6B, in an exemplary embodiment, the upper module UM includes a first dielectric constant control layer DCL1 and a second dielectric constant control layer DCL2. The first dielectric constant control layer DCL1 is disposed between the anti-reflector RPP and the input sensor ISP, and the second dielectric constant control layer DCL2 is disposed between the window WM and the anti-reflector RPP.

Each of the first and second dielectric constant control layers DCL1 and DCL2 may have a structure similar to the dielectric constant control layer DCL shown in FIGS. 5A and 5B. For example, the first dielectric constant control layer DCL1 includes a first base material AS1 and a first high dielectric constant material HDM1. The first base material AS1 may include an adhesive material. The adhesive material is not particularly limited as long as it is a transparent material having an adhesive property for optical use. The first high dielectric constant material HDM1 may include a material having a higher dielectric constant than the first base material AS1. The first high dielectric constant material HDM1 may include, for example, one of an antistatic agent, a metallic oxide, or a conductive filler. The first high dielectric constant material HDM1 may have a weight ratio greater than about 0 wt % and equal to or less than about 99 wt % with respect to the total weight of the first dielectric constant control layer DCL1. The weight ratio of the first high dielectric constant material HDM1 is not particularly limited.

The second dielectric constant control layer DCL2 includes a second base material AS2 and a second high dielectric constant material HDM2. The second base material AS2 may include an adhesive material. The second base material AS2 may be formed of the same material as the first base material AS1. However, the inventive concept is not limited thereto. For example, the second base material AS2 is not particularly limited as long as it is a transparent material having an adhesive property for optical use.

The second high dielectric constant material HDM2 may include a material having a higher dielectric constant than the second base material AS2. The second high dielectric constant material HDM2 may include, for example, one of an antistatic agent, a metallic oxide, or a conductive filler. The second high dielectric constant material HDM2 may have the same or different dielectric constant as the first high dielectric constant material HDM1. The second high dielectric constant material HDM2 may have a weight ratio greater than about 0 wt % and equal to or less than about 99 wt % with respect to the total weight of the second dielectric constant control layer DCL2. The weight ratio of the second high dielectric constant material HDM2 is not particularly limited. The weight ratio of the first high dielectric constant material HDM1 may be the same as or different from the weight ratio of the second high dielectric constant material HDM2.

The first and second high dielectric constant materials HDM1 and HDM2 each may include one of the materials used as the high dielectric constant material HDM described with reference to FIG. 5A.

Figure 7A:
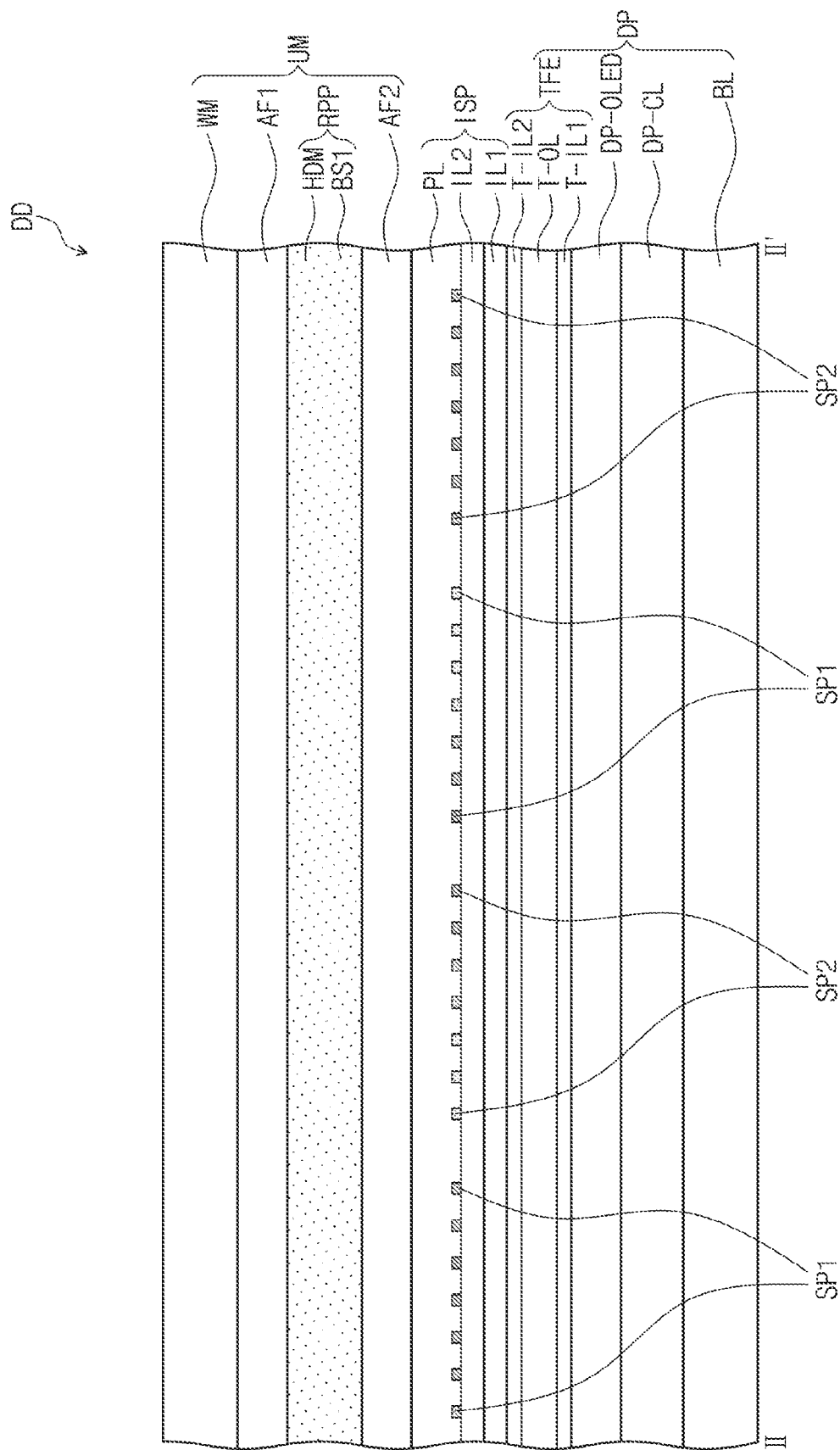
FIG. 7A is a cross-sectional view of a display device taken along line II-II' shown in FIG. 4 according to an exemplary embodiment of the inventive concept.
Figure 7B:
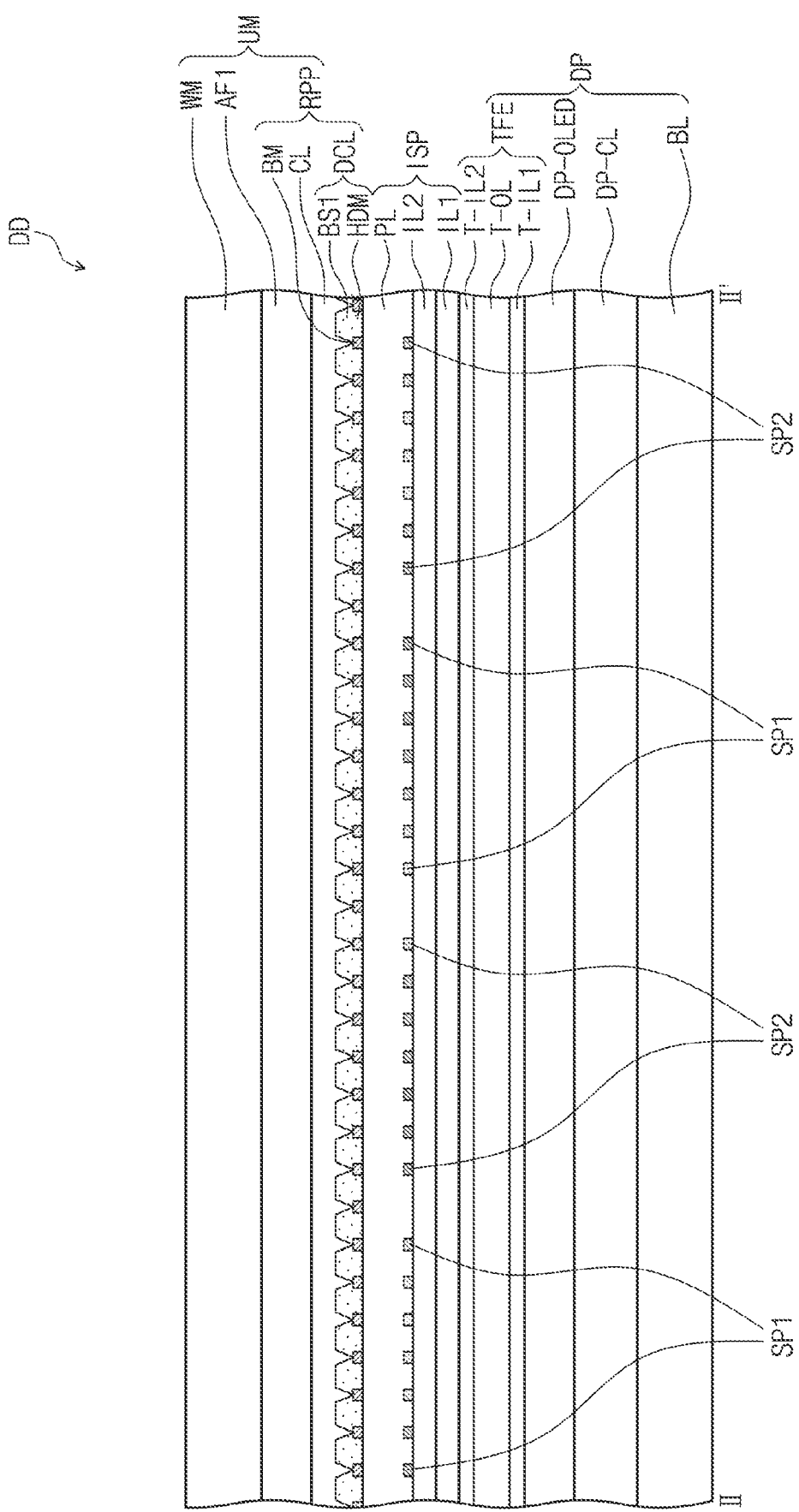
FIG. 7B is a cross-sectional view of a display device taken along line II-II' shown in FIG. 4 according to an exemplary embodiment of the inventive concept.
Figure 7C:
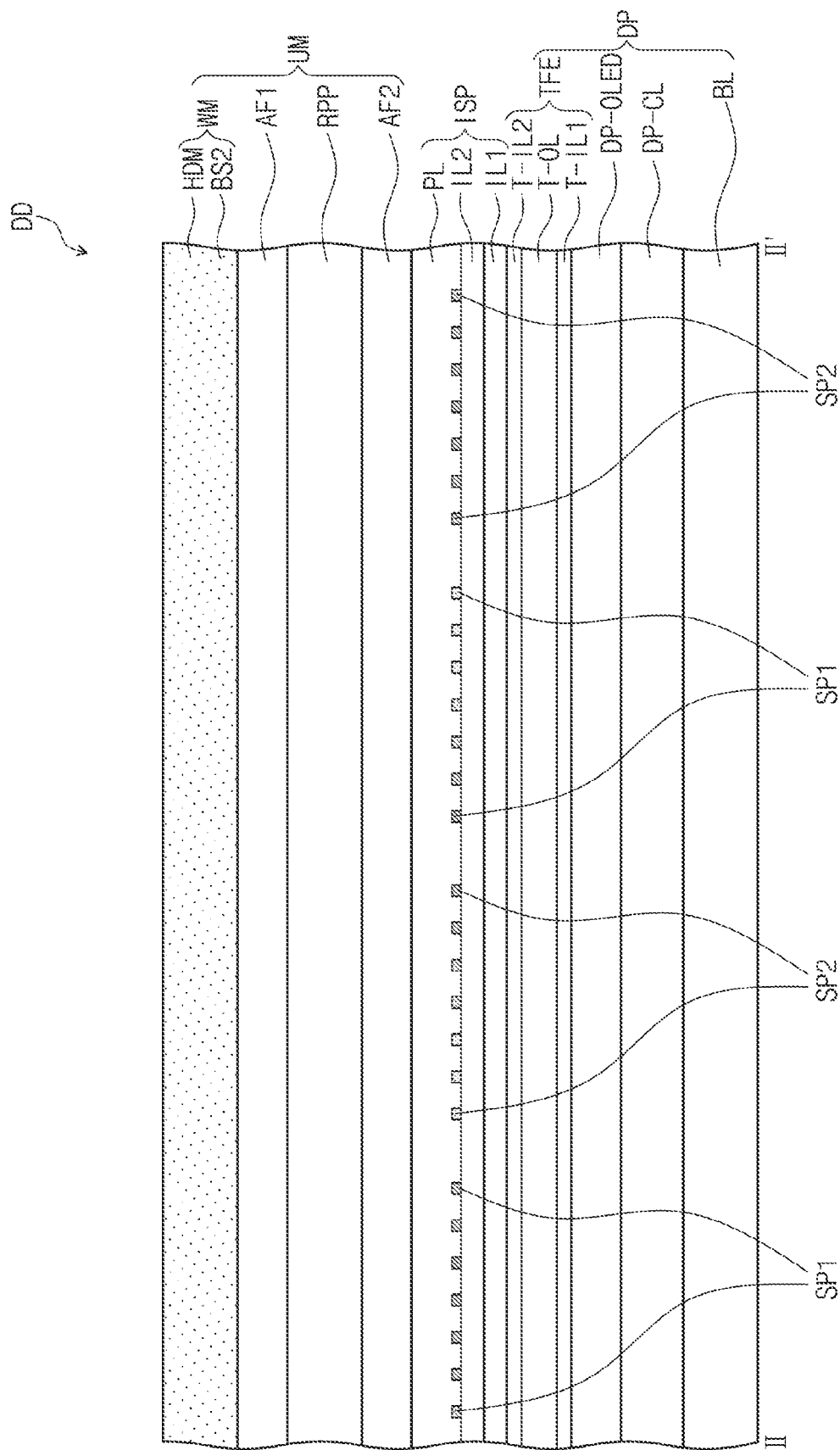
FIG. 7C is a cross-sectional view of a display device taken along line II-II' shown in FIG. 4 according to an exemplary embodiment of the inventive concept.

FIG. 7A is a cross-sectional view of a display device taken along line II-II' shown in FIG. 4 according to an exemplary embodiment of the inventive concept. FIG. 7B is a cross-sectional view of a display device taken along line II-II' shown in FIG. 4 according to an exemplary embodiment of the inventive concept. FIG. 7C is a cross-sectional view of a display device taken along line II-II' shown in FIG. 4 according to an exemplary embodiment of the inventive concept.

Referring to FIG. 7A, in the display device DD according to an exemplary embodiment of the inventive concept, the anti-reflector RPP may include a first base material BS1 and a high dielectric constant material HDM. The high dielectric constant material HDM may be uniformly distributed in the first base material BS1.

The anti-reflector RPP may include a stretched synthetic resin film. The first base material BS1 may include a polymer material. For example, the polymer material may include at least one of ethylene vinyl acetate (EVA), polycarbonate (PC), polyethylene terephthalate (PET), amorphous polyethylene terephthalate (APET), polypropylene terephthalate (PPT), polynaphthalene terephthalate (PEN), polyethylene terephthalate glycerol (PETG), polycyclohexylenedimethylene terephthalate (PCTG), modified triacetyl cellulose (TAC), cycloolefin polymer (COP), cycloolefin copolymer (COC), dicyclopentadiene polymer (DCPD), cyclopentadiene polymer (CPD), polymethylmethacrylate (PMMA), polyimide (PI), polyarylate (PAR), polyethersulfone (PES), polyetherimide (PEI), a silicone resin, a fluorine resin, or a modified epoxy resin.

The high dielectric constant material HDM may include a material having a higher dielectric constant than the first base material BS1. The high dielectric constant material HDM may include, for example, one of an antistatic agent, a metallic oxide, or a conductive filler. The high dielectric constant material HDM may include one of the materials used as the high dielectric constant material HDM described in FIG. 5A.

The high dielectric constant material HDM may have a weight ratio greater than about 0 wt % and equal to or less than about 99 wt % with respect to the total weight of the anti-reflector RPP. The first base material BS1 may have a weight ratio of greater than about 0 wt % to about 99 wt % or less with respect to the total weight of the anti-reflector RPP. The concentration of the high dielectric constant material HDM is not particularly limited, but may be set within a range that does not deteriorate the performance of the polarization function of the anti-reflector RPP.

The anti-reflector RPP of FIG. 7A is provided in the form of a stretched synthetic resin film, but the inventive concept is not limited thereto. As shown in FIG. 7B, the anti-reflector RPP may include a dielectric constant control layer DCL and a cover layer CL. The dielectric constant control layer DCL may be color filters used to perform an anti-reflection function. The color filters may be arranged in a predetermined shape. The arrangement of color filters may be determined in consideration of emission colors of the pixels PX included in the display panel DP (shown in FIG. 3). In this case, the dielectric constant control layer DCL may be directly disposed on the input sensor ISP. For example, the color filters may be directly disposed on the protective layer PL of the input sensor ISP. The color filters may be provided on the protective layer PL through a continuous process.

Each of the color filters may include a first base material BS1 and a high dielectric constant material HDM. The first base material BS1 may include a dye or pigment material having a predetermined color. The high dielectric constant material HDM may include a material having a higher dielectric constant than the first base material BS1. The high dielectric constant material HDM may include, for example, one of an antistatic agent, a metallic oxide, or a conductive filler. The high dielectric constant material HDM may include one of the materials used as the high dielectric constant material HDM described with reference to FIG. 5A.

The anti-reflector RPP may further include a black matrix BM disposed adjacent to the dielectric constant control layer DCL. The black matrix BM may be provided at positions corresponding to the first and second sensor parts SP1 and SP2 of the input sensor ISP (e.g., a non-emission area). The black matrix BM may block unnecessary light in the non-emission area. The black matrix BM may include a light blocking material that absorbs light.

The cover layer CL covers the dielectric constant control layer DCL and the black matrix BM, and compensates for a step difference between the dielectric constant control layer DCL and the black matrix BM. In an exemplary embodiment, the cover layer CL may include an organic material.

FIGS. 7A and 7B illustrate that according to exemplary embodiments, the anti-reflector RPP performs a dielectric constant control function. However, the inventive concept is not limited thereto. For example, as shown in FIG. 7C, in an exemplary embodiment, the window WM may perform a dielectric constant control function.

Referring to FIG. 7C, in an exemplary embodiment, the window WM may include a second base material BS2 and a high dielectric constant material HDM. The high dielectric constant material HDM may be uniformly distributed in the second base material BS2. The second base material BS2 may include a glass material or a plastic material. The plastic material may include at least one of, for example, polyimide (PI), polyamideimide (PAI), polyetheretherketone (PEEK), or polyetherimide (PEI). The window WM may be formed of a glass material including silicate. In an exemplary embodiment of the inventive concept, the glass material may further include various materials such that durability, surface smoothness, and transparency are excellent. For example, the glass material may be formed of materials such as aluminosilicate, borosilicate, and boroaluminosilicate.

The high dielectric constant material HDM may include a material having a higher dielectric constant than the second base material BS2. The high dielectric constant material HDM may include, for example, one of an antistatic agent, a metallic oxide, or a conductive filler. The high dielectric constant material HDM may include one of the materials used as the high dielectric constant material HDM described with reference to FIG. 5A.

Figure 8:
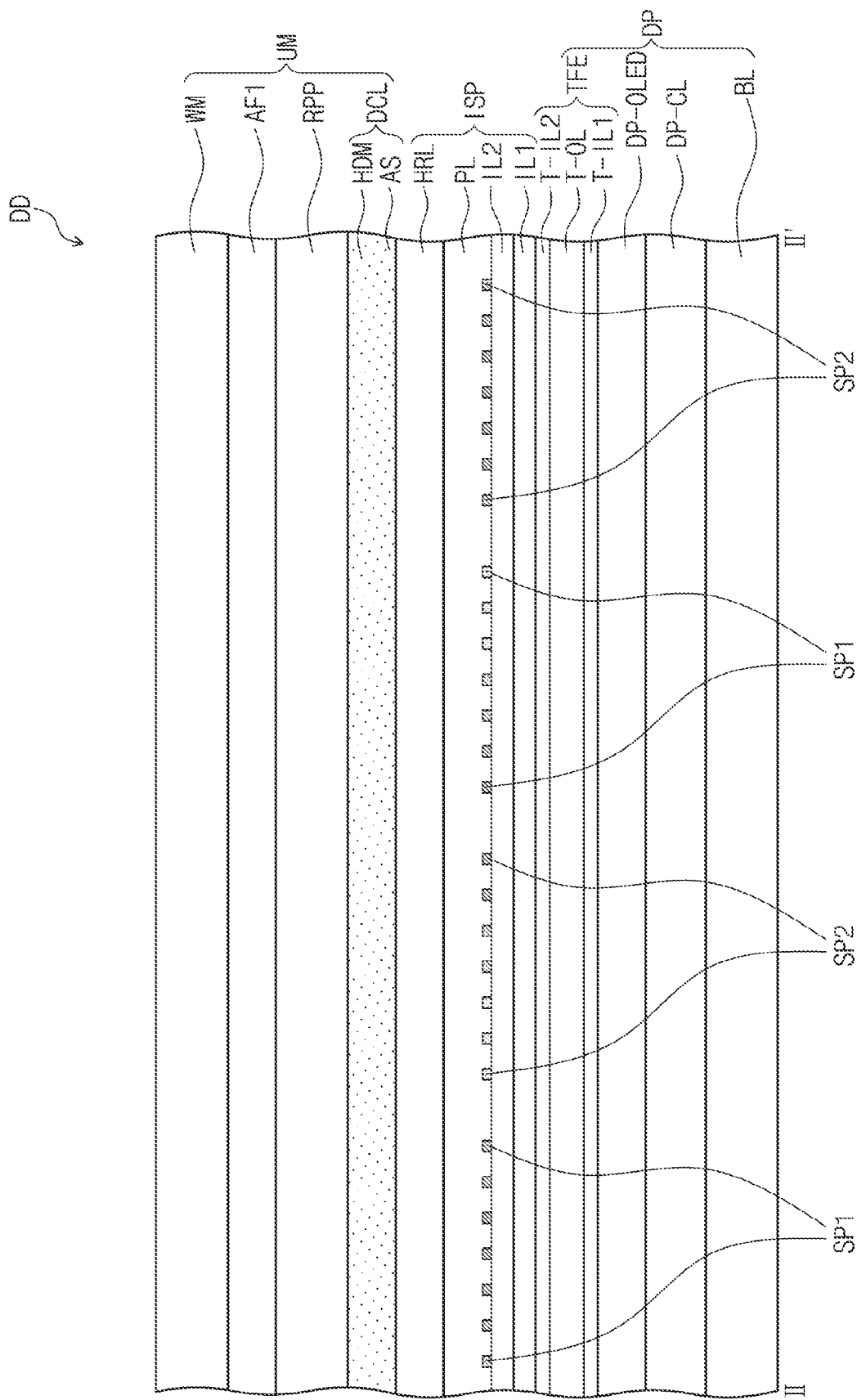
FIG. 8 is a cross-sectional view of a display device taken along line II-II' shown in FIG. 4 according to an exemplary embodiment of the inventive concept.

FIG. 8 is a cross-sectional view of a display device taken along line II-II' shown in FIG. 4 according to an exemplary embodiment of the inventive concept.

Referring to FIG. 8, in the display device DD according to an exemplary embodiment of the inventive concept, the input sensor ISP may further include a high refractive insulating layer HRL. The high refractive insulating layer HRL may be disposed on the protective layer PL of the input sensor ISP.

The high refractive insulating layer HRL may have a higher refractive index than the protective layer PL. For example, the high refractive insulating layer HRL may have a refractive index of about 1.65 to about 1.70. The high refractive insulating layer HRL may include an organic insulating material having a higher refractive index than the organic insulating material forming the protective layer PL. The high refractive insulating layer HRL may include, for example, $ZrO_2$.

The dielectric constant control layer DCL is disposed on the input sensor ISP. For example, the dielectric constant control layer DCL may be disposed on the high refractive insulating layer HRL. The anti-reflector RPP is disposed on the dielectric constant control layer DCL and is attached to the high refractive insulating layer HRL through the dielectric constant control layer DCL.

For convenience of description, since the dielectric constant control layer DCL shown in FIG. 8 has the same configuration as the dielectric constant control layer DCL shown in FIGS. 5A and 5B, a further description thereof is omitted.

According to exemplary embodiments of the inventive concept, the average dielectric constant of the upper module UM may be increased due to the inclusion of the dielectric constant control layer DCL. When the average dielectric constant of the upper module UM increases, the amount of change $\Delta Cm$ in capacitance of the input sensor ISP may increase. As a result, the sensing sensitivity of the input sensor ISP with relation to the external input EI (shown in FIG. 5B) may be improved without decreasing the distance between the first and second sensing parts SP1 and SP2 or increasing the area of each of the first and second sensing parts SP1 and SP2.

In a display device according to an exemplary embodiment of the inventive concept, an upper module disposed on an input sensor includes a dielectric constant control layer, which may improve the average dielectric constant of the upper module. As a result, an amount of change in capacitance due to external inputs of the input sensor may increase, thereby improving the sensing sensitivity of the input sensor.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. A display device, comprising:
a display panel;
an input sensor disposed on the display panel; and
an upper layer structure disposed on the input sensor,
wherein the upper layer structure comprises a plurality of layers sequentially stacked on the input sensor and a dielectric constant control layer which controls a sensing sensitivity of the input sensor,
wherein the dielectric constant control layer comprises:
a base material having an adhesive property; and
a high dielectric constant material having a higher dielectric constant than the base material.

2. The display device of claim 1, wherein
the dielectric constant control layer is disposed adjacent to at least one of the plurality of layers.

3. The display device of claim 1, wherein the high dielectric constant material has a dielectric constant of about 2.5 or greater.

4. The display device of claim 1, wherein the high dielectric constant material has a weight ratio greater than about 0 wt % and equal to or less than about 99 wt %.

5. The display device of claim 1, wherein the high dielectric constant material comprises one of an antistatic agent, a metallic oxide, or a conductive filler.

6. The display device of claim 5, wherein the antistatic agent comprises at least one of ethoxylated amine, lauric diethanolamide, ammonium (NH4+), phosphonium (PH4+), imidazolluim, pyridinium, or lithium ions (Li+).

7. The display device of claim 5, wherein the metallic oxide comprises at least one of $ZrO_2$, $Ta_2O_5$, $SnO_2$, $Nb_2O_3$, $TiO_2$, $Sb_2O_3$, $V_2O_5$, FeO, SrO, $CuO_2$, ZnO, $Nb_2O_5$, $Ta_2O_5$, $Y_2O_3$, $CaTiO_3$, $MgZrSrTiO_6$, $MgTiO_3$, $MgAl_2O_4$, $BaZrO_3$, $BaTiO_3$, $BaSnO_3$, $BaNb_2O_6$, $BaTa_2O_6$, $BaSrTiO_3$, $WO_3$, $MnO_2$, $SrZrO_3$, $SnTiO_4$, $ZrTiO_4$, $CaZrO_3$, $CaSnO_3$, $CaWO_4$, $MgTa_2O_6$, $MrZrO_3$, $La_2O_3$, $CaZrO_3$, $MgSnO_3$, $MgNb_2O_6$, $SrNb_2O_6$, $MgTa_2O_6$, or $Ta_2O_3$.

8. The display device of claim 5, wherein the conductive filler comprises at least one of metal nanoparticles, single-walled carbon nanotubes, multi-walled carbon nanotubes, graphene, graphite, carbon black, carbon fiber, or fullerene.

9. The display device of claim 1, wherein the upper layer structure further comprises:
an anti-reflector disposed on the input sensor; and
a window disposed on the anti-reflector.

10. The display device of claim 9, wherein the dielectric constant control layer is disposed between the anti-reflector and the input sensor.

11. The display device of claim 10, wherein the upper layer structure further comprises:
an adhesive film disposed between the window and the anti-reflector.

12. The display device of claim 9, wherein the dielectric constant control layer is disposed between the window and the anti-reflector.

13. The display device of claim 12, wherein the upper layer structure further comprises:
an adhesive film disposed between the anti-reflector and the input sensor.

14. The display device of claim 9, wherein the dielectric constant control layer comprises:
a first dielectric constant control layer disposed between the anti-reflector and the input sensor; and
a second dielectric constant control layer disposed between the window and the anti-reflector.

15. The display device of claim 14, wherein the first and second dielectric constant control layers each comprise:
a base material having an adhesive property; and
a high dielectric constant material having a higher dielectric constant than the base material.

16. The display device of claim 9, wherein at least one of the anti-reflector or the window comprises:
a base material; and
a high dielectric constant material having a higher dielectric constant than the base material.

17. The display device of claim 16, wherein the high dielectric constant material comprises one of an antistatic agent, a metallic oxide, or a conductive filler.

18. The display device of claim 1, wherein the display panel comprises:
a display element layer including a light emitting element; and
an encapsulation layer covering the display element layer.

19. The display device of claim 18, wherein the input sensor is directly disposed on the encapsulation layer.

20. The display device of claim 19, wherein the input sensor comprises:
a protective layer; and
a high refractive insulating layer disposed on the protective layer and having a higher refractive index than the protective layer.

21. A display device, comprising:
a display panel;
an input sensor disposed on the display panel; and
a dielectric constant control layer disposed on the input sensor,
wherein the dielectric constant control layer controls a sensing sensitivity of the input sensor and comprises:
a base material having an adhesive property; and
a high dielectric constant material having a higher dielectric constant than the base material.

22. The display device of claim 21, wherein the high dielectric constant material has a dielectric constant of about 2.5 or greater.

23. The display device of claim 21, wherein the high dielectric constant material has a weight ratio greater than about 0 wt % and equal to or less than about 99 wt %.

24. The display device of claim 21, wherein the high dielectric constant material comprises one of an antistatic agent, a metallic oxide, or a conductive filler.

25. A display device, comprising:
a display panel;
an input sensor disposed on the display panel,
wherein the input sensor comprises a plurality of first sensing electrodes and a plurality of second sensing electrodes crossing the first sensing electrodes,
wherein each of the first sensing electrodes comprises a plurality of first sensing parts, and each of the second sensing electrodes comprises a plurality of second sensing parts; and
a dielectric constant control layer disposed on the input sensor,
wherein the dielectric constant control layer overlaps the first sensing parts and the second sensing parts, and increases an amount of change in capacitance between the first sensing parts and the second sensing parts.

26. The display device of claim 25, wherein the dielectric constant control layer comprises:
a base material having an adhesive property; and
a high dielectric constant material having a higher dielectric constant than the base material.

27. The display device of claim 26, wherein the base material adheres the input sensor to an upper layer structure disposed on the input sensor, and the dielectric constant control layer is disposed between the input sensor and the upper layer structure.

* * * * *